US005711058A

United States Patent [19]

Frey

[11] Patent Number: 5,711,058

[45] Date of Patent: Jan. 27, 1998

[54] METHOD FOR MANUFACTURING TRANSDUCER ASSEMBLY WITH CURVED TRANSDUCER ARRAY

[75] Inventor: Gregg W. Frey, East Wenatchee, Wash.

[73] Assignee: General Electric Company, Milwaukee, Wis.

[21] Appl. No.: 581,139

[22] Filed: Dec. 29, 1995

Related U.S. Application Data

[63] Continuation-in-part of Ser. No. 343,054, Nov. 21, 1994, Pat. No. 5,541,468.

[51] Int. Cl.[6] .......... H01L 41/22

[52] U.S. Cl. .......... 29/25.35; 310/335

[58] Field of Search .......... 29/25.35; 310/327, 310/334, 335

[56] References Cited

U.S. PATENT DOCUMENTS

| | | | |
|---|---|---|---|
| 4,686,408 | 8/1987 | Ishiyama | 310/334 |
| 5,109,860 | 5/1992 | Gelly et al. | 29/25.35 X |
| 5,423,220 | 6/1995 | Finsterwald et al. | 73/642 |

*Primary Examiner*—Carl E. Hall
*Attorney, Agent, or Firm*—Dennis M. Flaherty; John H. Pilarski

[57] ABSTRACT

A method of manufacturing a transducer assembly having a curved transducer array. The method includes the steps of fabricating a laminated assembly by bonding the following layers together: a layer of electrically conductive, acoustic matching material, a layer of piezoelectric ceramic, a flexible printed circuit board and a layer of acoustic damping material. The acoustic damping material changes from an inflexible state to a flexible state when heated. The laminated assembly is then diced to a depth so that the only undiced portion is a portion of the acoustic damping layer. A core body having a curved front face in the shape of a cylindrical section is fabricated. Then at least the undiced portion of the layer of acoustic damping material is heated into a flexible state. The heated undiced portion of the layer of acoustic damping material is flexed to conform to the curved front face of the core body. Then the flexed undiced portion of the layer of acoustic damping material is bonded to the curved front face of said core body. As a result, the piezoelectric elements are arranged along a curve.

9 Claims, 4 Drawing Sheets

METHOD FOR MANUFACTURING TRANSDUCER ASSEMBLY WITH CURVED TRANSDUCER ARRAY

RELATED PATENT APPLICATION

This application is a continuation-in-part application of U.S. patent application Ser. No. 08/343,054 filed on Nov. 21, 1994, which issued on Jul. 30, 1996 as U.S. Pat. No. 5,541,468.

FIELD OF THE INVENTION

This invention generally relates to probes used in ultrasonic imaging of the human anatomy. In particular, the invention relates to ultrasonic transducer arrays for use in electronic beam imagers to make wide field-of-view scans.

BACKGROUND OF THE INVENTION

A conventional ultrasonic probe comprises a transducer package which must be supported within the probe housing. As shown in FIGS. 1 and 2, a conventional transducer package 2 comprises a linear array 4 of narrow transducer elements. Each transducer element is made of piezoelectric ceramic material. The piezoelectric material is typically lead zirconate titanate (PZT), polyvinylidene difluoride, or PZT ceramic/polymer composite.

The design and fabrication of individual transducer elements with desirable acoustic properties, e.g., high sensitivity, wide bandwidth, short impulse response, and wide field of view, is a well known art.

Typically, each transducer element has a metallic coating on opposing front and back faces to serve as electrodes. The metallic coating on the front face serves as the ground electrode. The ground electrodes of the transducer elements are all connected to a common ground. The metallic coating on the back face serves as the signal electrode. The signal electrodes of the transducer elements are connected to respective electrical conductors formed on a flexible printed circuit board (PCB) 6. The flexible PCB can have signal runs which fan out so that miniature coaxial cables (not shown) can be attached directly. Since the circuit board is flexible, the wiring assembly can be folded to occupy a very small cross section while retaining considerable freedom for motion.

During operation, the signal and ground electrodes of the piezoelectric transducer elements are connected to an electrical source having an impedance $Z_8$. When a voltage waveform v(t) is developed across the electrodes, the material of the piezoelectric element compresses at a frequency corresponding to that of the half-wave resonance of the ceramic, thereby emitting an ultrasonic wave into the media to which the piezoelectric element is coupled. Conversely, when an ultrasonic wave impinges on the ceramic material of the piezoelectric element, the latter produces a corresponding voltage across its terminals and the associated electrical load component of the electrical source.

In conventional applications, each transducer element produces a burst of ultrasonic energy when energized by a pulsed waveform produced by a transmitter (not shown). The pulses are transmitted to the transducer elements via the flexible PCB 6. This ultrasonic energy is transmitted by the probe into the tissue of the object under study. The ultrasonic energy reflected back to transducer array 4 from the object under study is converted to an electrical signal by each receiving transducer element and applied separately to a receiver (not shown).

Typically, the front surface of each transducer array element is covered with one or more acoustic impedance matching layers that improve the coupling with the medium in which the emitted ultrasonic waves will propagate. For the sake of discussion, FIG. 2 shows a transducer package having two impedance matching layers 8 and 10. For example, the first matching layer 8 may be made of borosilicate glass and the second matching layer 10 may be made of acrylic resin plastic. The impedance matching layers transform the high acoustic impedance of the transducer elements to the low acoustic impedance of the human body and water.

The transducer package 2 further comprises a mass of suitable acoustical damping material having high thermal conductivity, e.g., silicone/tungsten, positioned at the back surface of the transducer array 4. This backing layer 12 is acoustically coupled to the rear surface of the elements of transducer array 4 (via the acoustically transparent flexible PCB) to absorb ultrasonic waves that emerge from the back side of each element so that they will not be partially reflected and interfere with the ultrasonic waves propagating in the forward direction. The backing layer 12 also dissipates heat generated by the transducer elements away from the probe surface/transducer face toward the interior/rear of the probe.

The transducer elements, signal and ground connections, matching layers and backing layer are all bonded together to form the transducer package. During assembly of the ultrasonic probe, the transducer package must be held securely within the probe housing (not shown in FIG. 1). Typically, this is accomplished by securing the transducer package within a four-sided array case 14, i.e., a "box" having four side walls but no top or bottom walls. The array case is made of electrically conductive material and provides a common ground for connection with the ground electrodes of the transducer elements. During manufacture of the ultrasonic probe, the array case/transducer package combination is secured within the probe housing. The interior of the probe housing is then filled with thermal/acoustic potting material.

In most conventional probe designs, the array case and the outermost acoustic impedance matching layer 10 of the transducer package respectively form the four side walls and the bottom wall of a five-sided box when array case 14 and outermost matching layer 10 are bonded together, as shown in FIG. 2. Other portions of the transducer package 2 occupy the recess defined by the array case and the outermost matching layer 10. This construction has the disadvantage that the array case and the outermost matching layer must be separately fabricated and then the outermost matching layer must undergo two separate bonding operations: one when it is bonded to the transducer package and another when it is bonded to the array case. These multiple manufacturing steps increase the cost of manufacture.

To solve the foregoing problem, U.S. patent application Ser. No. 08/343,054 taught to build a linear array ultrasonic transducer having a monolithic transducer array case with a bottom wall suitable for use as an acoustic impedance matching layer. This array case is made from electrically conductive material having an acoustic impedance less than the acoustic impedance of piezoelectric ceramic. The preferred material is metal-impregnated graphite. Metal-impregnated graphite is electrically conductive; is easy and inexpensive to precisely machine into the desired shape; and has the desired acoustic impedance for use as a matching layer. Thus, an array case which also performs the function of the outermost matching layer can be fabricated as a monolithic structure having the shape of a five-sided box.

In the alternative, the monolithic array case can be open at each end, i.e., a channel extends the full length of the array case. This open-ended monolithic array case 16, shown in FIG. 3, is easier and cheaper to manufacture than is a closed-ended monolithic array case. Starting with a solid block of material, the three-sided structure, consisting of a pair of side walls 18 and 20 and a bottom wall 22, can be fabricated by milling or grinding a first channel 24 of constant cross section from one end of the block to the other end. The width of the channel 24 should be slightly greater than the width of the transducer package. In a second milling or grinding step, a second channel 26 can be formed on the bottom wall 22 in communication with channel 24. Channel 26 serves to center the transducer package 2 relative to the array case 16 while epoxy resin 28 is setting in the gaps between array case walls 18 and 20 and the stack comprising flexible PCB 6 sandwiched between transducer array 4 and backing layer 12. The second acoustic matching layer 10 can be bonded to the bottom of the monolithic array case 16 either before or after the transducer stack is inserted in the case. The entire assembly is then diced from the surface of the second acoustic matching layer to a predetermined depth D (see FIG. 4) such that the kerfs (not shown) of the diced assembly extend completely through the acoustic matching layer 10, the piezoelectric ceramic layer which becomes the transducer array 4, and the flexible PCB 6 and partly through the backing layer 12 and array case side walls. Because the array case side walls are not cut completely, the array case is rigid.

The advantages of using a monolithic array case over the conventional two-piece array case/matching layer combination include at least the following: (1) one machined piece is required instead of two independently machined pieces that must be bonded together later, thereby reducing the number of parts and the number of manufacturing steps; (2) the monolithic array case provides improved structural protection of the fragile transducer element array; and (3) a stronger ground connection is made between the array case and the adjacent transducer elements as applicable to linear array. However, it is not possible to manufacture a curved transducer array by following the above-described steps.

SUMMARY OF THE INVENTION

The present invention is a curved transducer array and related method of manufacture. The curved transducer array of the invention comprises a monolithic array case in which the bottom wall serves as an acoustic matching layer. However, the side walls of the monolithic array case of the invention have less height and are diced all the way through. This allows the transducer assembly to flex and facilitates the cost-efficient construction of an ultrasonic probe having a curved transducer array.

The method of manufacturing a curved transducer array in accordance with the invention comprises the steps of: fabricating a three-sided array case made of electrically conductive, acoustic matching material; bonding a planar acoustic matching layer to a front face of the array case; bonding a flexible PCB to one side of a planar piezoelectric ceramic layer; bonding a planar strip of backing material to the flexible PCB so that the flexible PCB is sandwiched between the backing strip and the piezoelectric ceramic layer; placing the flexible PCB sandwich in the array case and bonding a front face of the piezoelectric ceramic layer to the array case; and then dicing the resulting laminated stack to a predetermined depth such that the resulting kerfs divide the array case into a multiplicity of elements which are not connected to each other. However, the kerfs do not pass through the entire depth of the backing strip.

After the dicing operation, the undiced portion of the backing strip forms a spine supporting a multiplicity of laminated elements. Each laminated element comprises an acoustic matching layer segment, an array case segment, a piezoelectric ceramic layer segment and a backing strip segment.

The method of manufacturing a curved transducer array in accordance with the present invention further comprises the steps of: forming a backing core having a curved front face in the form of a cylindrical section having a desired curvature; heating the backing strip to a temperature at which the backing material becomes flexible; flexing the backing strip to conform to the shape of the curved front face of the backing core; and bonding the undiced portion of the backing strip to the curved front face of the backing core.

When the flexible spine formed by the undiced portion of the heated backing strip is flexed to conform to the curvature of the backing core front face, this causes the array of lamination elements to spread open. Since the height of the unflexed laminated stack is constant in the longitudinal direction, flexure of the stack produces a curved transducer array having the same curvature as that of the backing core.

DETAILED DESCRIPTION OF THE PREFERRED EMBODIMENTS

Figure 1:
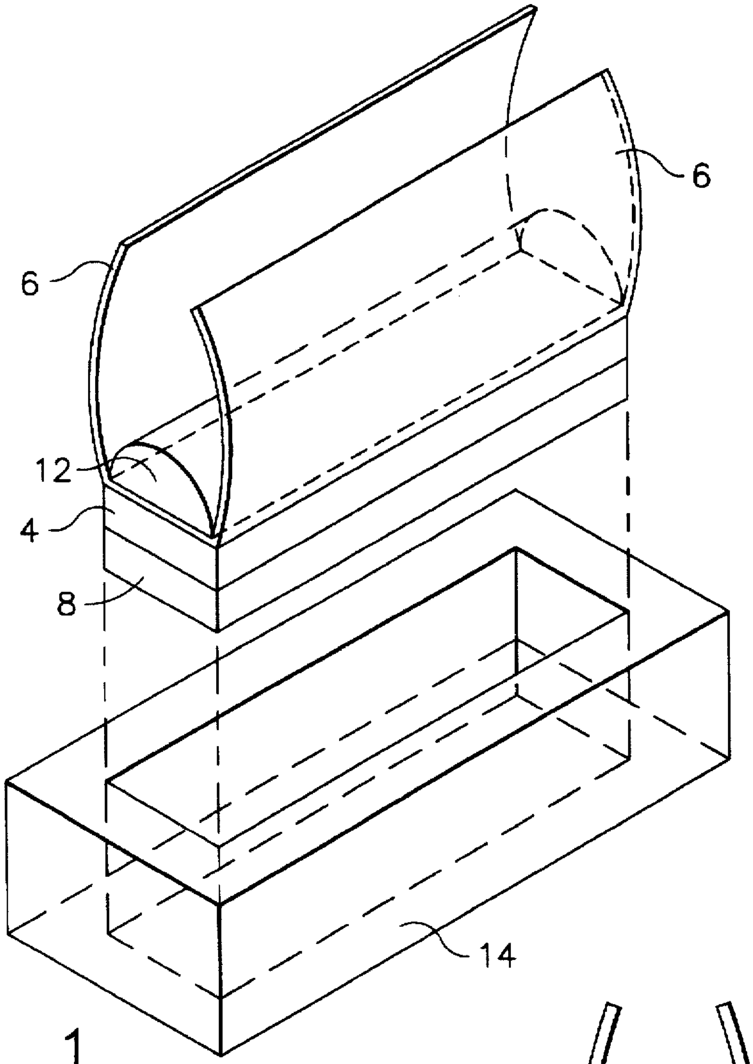
FIG. 1 is a schematic exploded isometric view of a conventional stackup of a transducer package and an array case for use in an ultrasonic probe.
Figure 2:
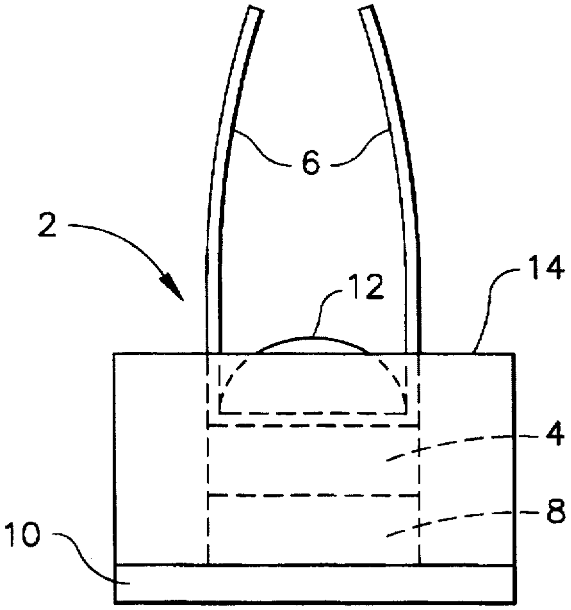
FIG. 2 is a schematic end view of a conventional transducer package/array case combination showing a five-sided box formed by a four-sided array case and an outermost matching layer.
Figure 3:
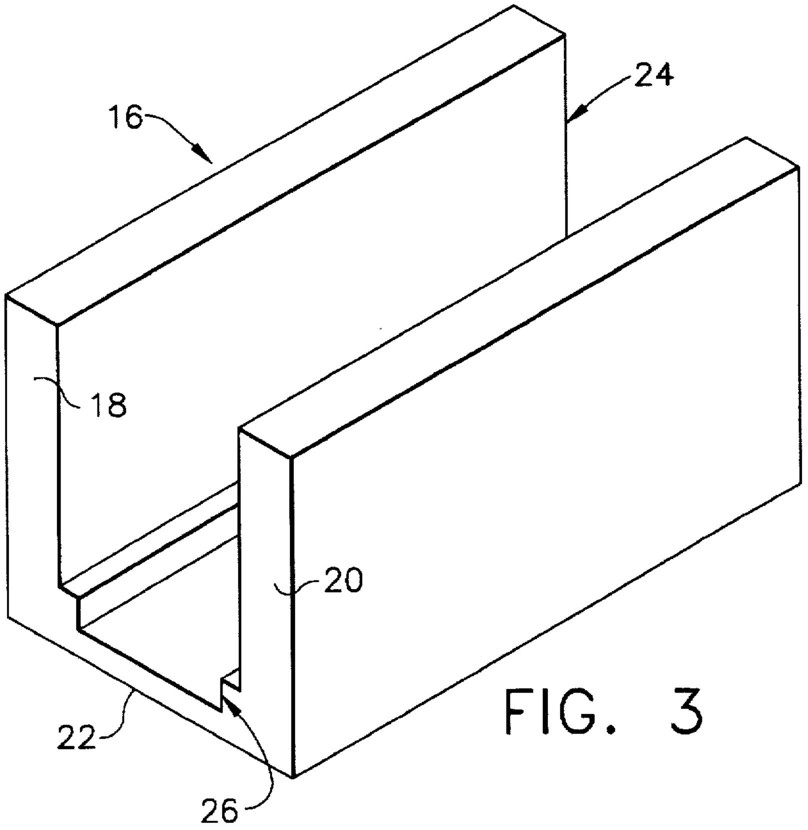
FIG. 3 is a schematic isometric view of a three-sided open-ended monolithic array case.
Figure 4:
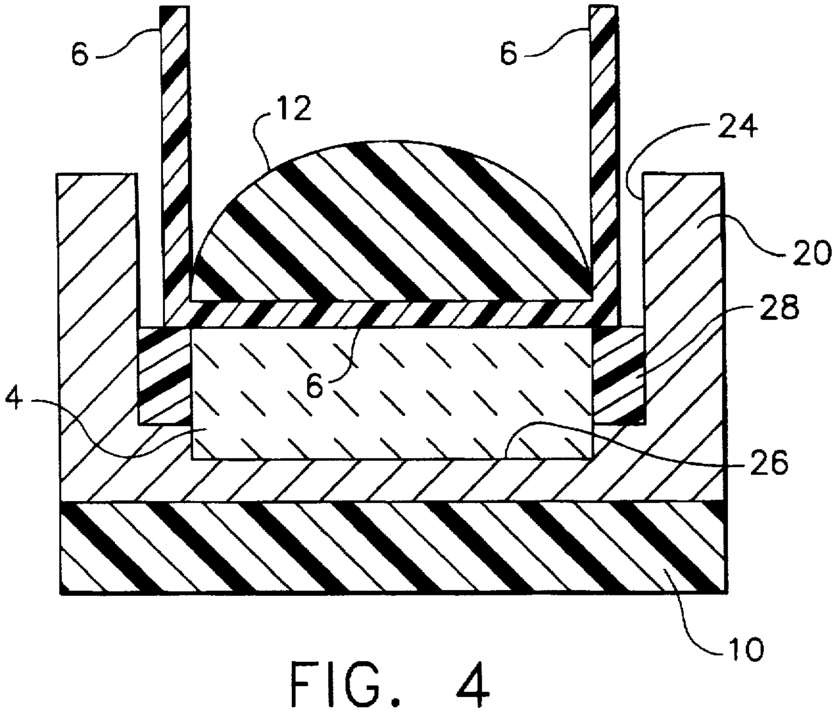
FIG. 4 is a schematic sectional view of a conventional transducer package/array case combination showing a three-sided open-ended array case made of electrically conductive, acoustic matching material.
Figure 5A:
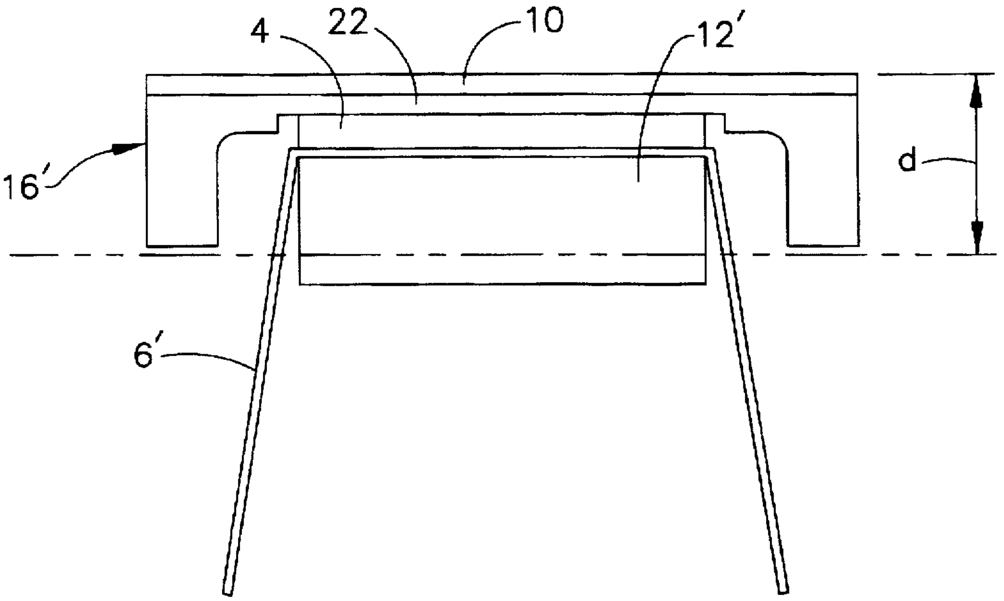
FIG. 5A is a schematic end view of a flat precursor transducer assembly in accordance with the preferred embodiment of the invention.

Referring to FIG. 5A, the method of manufacturing a transducer assembly in accordance with the present invention requires the fabrication of a three-sided array case 16' made of electrically conductive, acoustic matching material, the array case having a planar bottom wall and a pair of side walls extending from the bottom wall to form a channel. This monolithic array case is similar to that shown in FIG. 3 except that the height of the side walls 20 is relatively shortened so that the side walls are cut completely during the dicing operation. While the bottom wall 22 of the array case will ultimately serve as an acoustic matching layer, a second acoustic matching layer 10 may be bonded to the front face of the array case. However, a second acoustic matching layer is not a requirement of the present invention.

In accordance with a further step of the method of manufacture, a transducer stack is formed by laminating a flexible PCB 6' to a rear face of a planar piezoelectric ceramic layer 4 having electrodes formed thereon and then laminating a planar strip 12' of backing material on top of the flexible PCB 6'. The backing material may be made of epoxy resin impregnated with granules of metal oxide-loaded silicone rubber. This backing material is relatively inflexible at room temperature.

The resulting stack is attached to the array case 16' by bonding the front face of the piezoelectric ceramic layer 4 to the interior surface of the bottom wall 22 of the array case. The backing strip 12' has a thickness such that it projects beyond the rear limits of the array case (as shown in FIG. 5A) when the transducer stack and the array case are bonded together.

Thereafter, the transducer package is diced to a depth d which lies below the lower (rear) limits of the array case 16', but does not lie below the lower (rear) limits of the backing strip 12'. Thus, the resulting kerfs 30 (shown in FIG. 6) divide the transducer package into a multiplicity of laminated elements 32 which are each connected to the undiced portion or spine 34 of the backing strip 12', but are not connected to each other. The spine 34 supports the multiplicity of laminated elements.

Figure 6:
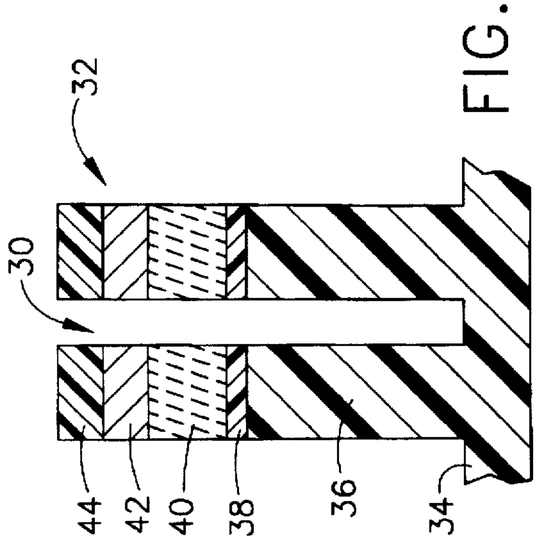
FIG. 6 is a schematic sectional view of a pair of adjacent elements of the flat precursor transducer assembly of FIG. 5A after the dicing operation.

In accordance with the preferred embodiment, each lamination element 32 comprises a plurality of layers bonded in a stack, as shown in detail in FIG. 6. The base of each stack is a backing layer 36 of acoustic damping material extending from and integrally formed with the spine 34. The remaining layers of the stack include: a strip 38 of flexible PCB bonded on one side to the backing layer 36; a piezoelectric ceramic layer 40 bonded to the other side of the PCB strip 38; a layer 42 of electrically conductive, acoustic matching material bonded to the piezoelectric ceramic layer 40; and an optional layer 44 of electrically insulating, acoustic matching material bonded to layer 42. The preferred material for layer 42 is metal-impregnated graphite.

Figure 7:
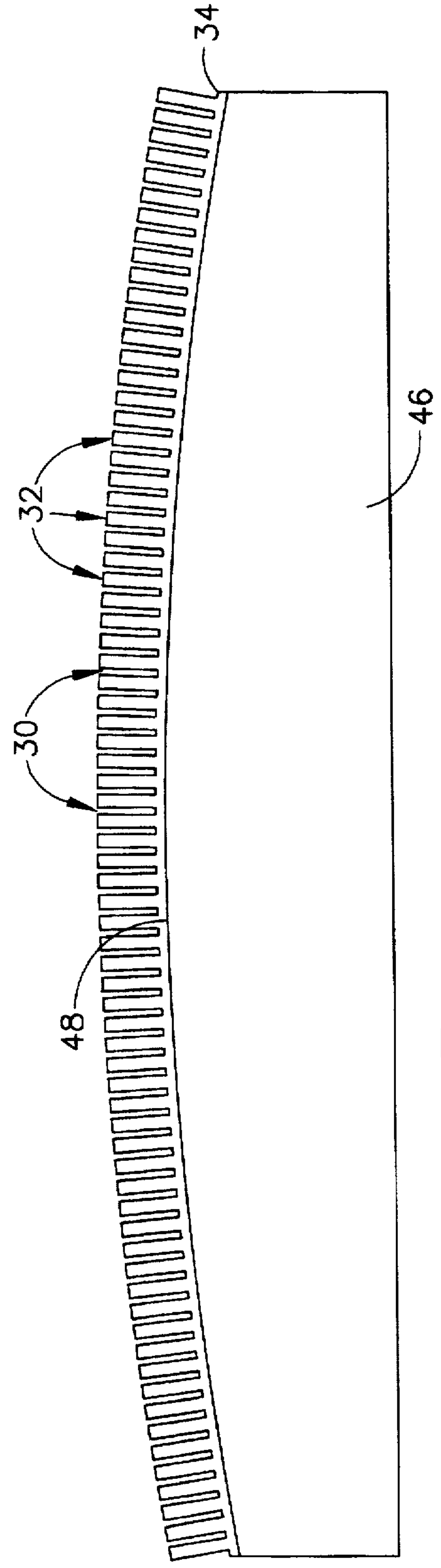
FIG. 7 is a schematic side view showing a flexed precursor transducer assembly bonded to a backing core in accordance with the present invention.

In accordance with the present invention, a backing core 46 is fabricated as a solid body having a curved front face 48 (see FIG. 7). The curved front face 48 is a cylindrical section having a profile in the shape of a circular arc or any other suitable curve. After dicing of the transducer package and fabrication of the backing core, the diced transducer package is heated in an oven to a temperature of about 50° C. for a duration of time sufficient to render the backing strip in a plastic state. While the backing strip is plastic, adhesive is applied to the curved front face 48 of the backing core and then the hot spine 34 is flexed to conform to the contour of the curved front face of the backing core.

In the case where additional acoustic damping is required, the backing core 46 is made of the same material as the backing strip or other suitable acoustic damping material. In the case where additional acoustic damping is not required, the backing core may be made of a material, such as aluminum alloy, having high thermal conductivity. In the latter case, the backing core acts as a heat sink which dissipates heat produced by the ultrasonic vibrations propagating through the transducer package.

When the flexible spine 34 formed by the undiced portion of the heated backing strip is bonded to the backing core, the spine flexes to conform to the curvature of the backing core front face. This in turn causes the array of lamination elements to spread open. Since the height of each layer of the unflexed laminated stack is constant in the longitudinal direction, flexure of the stack produces a curved transducer array having the same curvature as that of the front face of the backing core. In the case where curved front face 48 is a circular cylindrical section, the lamination elements 32 are aligned along radii which meet at the center of curvature of front face 48. However, it should be apparent that transducer arrays having curved profiles other than arcs of a circle can be manufactured in accordance with the present invention.

Figure 5B:
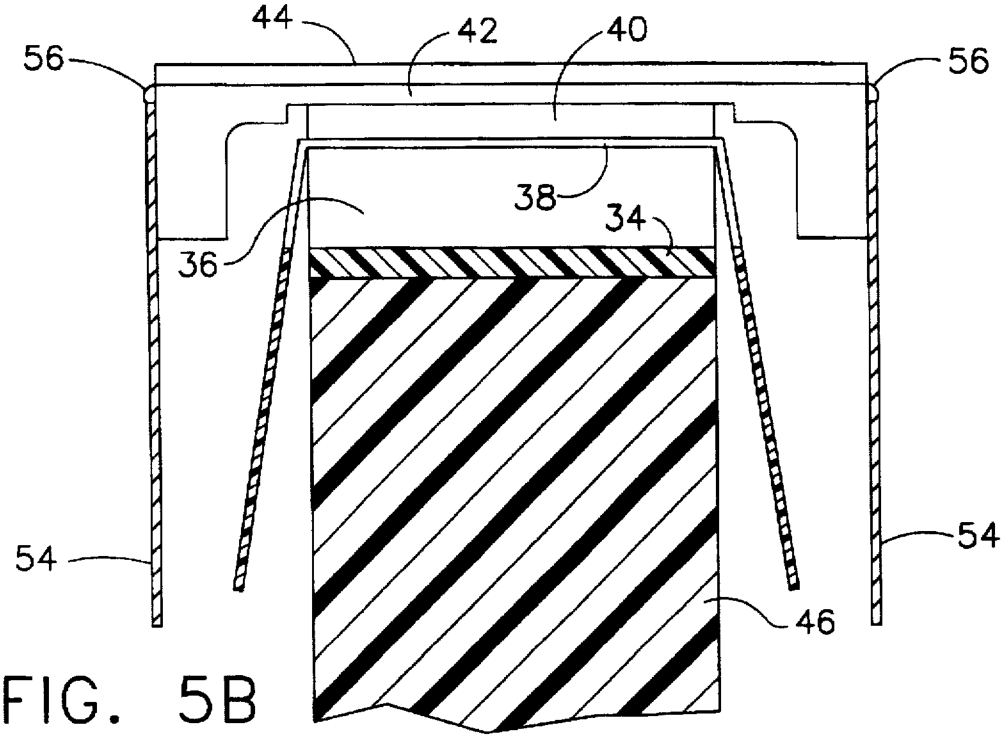
FIG. 5B is a schematic sectional view of the transducer assembly of FIG. 5A after it has been diced, heated, flexed and bonded to a curved backing core in accordance with the preferred embodiment of the invention.
Figure 8:
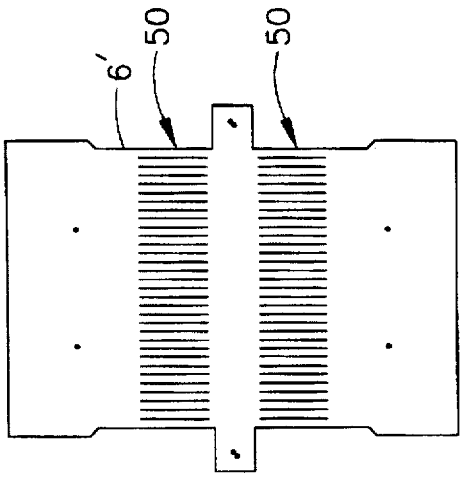
FIG. 8 is a plan view of a flexible printed circuit board incorporated in the transducer assembly of the present invention.

During flexure of the undiced portion of the backing strip, the undiced and folded portions of the flexible PCB 6' on opposite sides of the stack (see FIG. 5B) tend to wrinkle. In accordance with a further aspect of the invention, wrinkling of the flexible PCB 6' is avoided by providing a respective array of spaced parallel slits 50 (see FIG. 8) on each undiced and folded portion of the flexible PCB. The slits may be spaced so that the conductive traces (not shown) on the flexible PCB are segregated into groups equal in number, e.g., three.

After the backing strip has been bonded to the curved front face of the backing core, a pair of electrically conductive ground plates 54 are electrically connected to opposite sides of the segmented array case using joints 56 made of electrically conductive epoxy. These ground plates provide redundant ground connections to the braided sheath (not shown) of a multi-wire coaxial cable. The flexible PCB has a multiplicity of conductive traces etched on a substrate of flexible electrically insulating material, which traces connect the signal electrodes of the transducer array with the wires of the multi-wire coaxial cable.

The foregoing preferred embodiment of the invention has been disclosed for the purpose of illustration. Variations and modifications which do not depart from the broad concept of the invention will be readily apparent to those skilled in the design of ultrasonic probes. All such variations and modifications are intended to be encompassed by the claims set forth hereinafter.

I claim:

1. A method of manufacturing a transducer assembly having a curved transducer array, comprising the steps of:

fabricating an array case having a planar bottom wall and a pair of side walls extending from the bottom wall to form a channel, said array case being made of electrically conductive, acoustic matching material and said side walls having a predetermined height;

fabricating a laminated assembly having a depth greater than said predetermined height of said side walls by bonding a stack of layers to said bottom wall of electrically conductive, acoustic matching material, said stack being arranged in said channel of said array case and comprising a layer of piezoelectric ceramic, a flexible printed circuit board and a layer of acoustic damping material arranged in that order, said piezoelectric ceramic layer being bonded to said bottom wall of electrically conductive, acoustic matching material, and said acoustic damping material having a property whereby said acoustic damping material changes from an inflexible state to a flexible state when heated;

dicing said flat laminated array to a depth so that said bottom wall and said side walls of electrically conductive, acoustic matching material, said layer of piezoelectric ceramic, and said flexible printed circuit board are completely cut in a depthwise direction into respective segments and said layer of acoustic damping material is only partially cut in said depthwise direction so that an undiced portion of said layer of acoustic damping material supports said respective segments;

fabricating a core body having a curved front face in the shape of a cylindrical section;

heating at least said undiced portion of said layer of acoustic damping material until said acoustic damping material is flexible;

flexing said heated undiced portion of said layer of acoustic damping material to conform to said curved front face of said core body; and bonding said flexed undiced portion of said layer of acoustic damping material to said curved front face of said core body.

2. The method of manufacture as defined in claim 1, wherein said core body is made of acoustic damping material.

3. The method of manufacture as defined in claim 1, wherein said electrically conductive, acoustic matching material is metal-impregnated graphite.

4. The method of manufacture as defined in claim 1, wherein said laminated assembly further comprises a layer of electrically insulating, acoustic matching material which is bonded to said layer of electrically conductive, acoustic matching material.

5. The method of manufacture as defined in claim 1, wherein said acoustic damping material is epoxy resin impregnated with granules of metal oxide-loaded silicone rubber.

6. The method of manufacture as defined in claim 1, wherein said core body is made of material having a relatively high thermal conductivity.

7. The method of manufacture as defined in claim 6, wherein said material of relatively high thermal conductivity is aluminum alloy.

8. The method of manufacture as defined in claim 1, further comprising the step of slitting said flexible circuit board in two regions separated by an unslit region sandwiched between said layer of piezoelectric ceramic and said layer of acoustic damping material.

9. The method of manufacture as defined in claim 1, further comprising the step of electrically connecting a pair of electrically conductive ground plates to opposite sides of each segment of said layer of electrically conductive, acoustic matching material using electrically conductive epoxy.

* * * * *